United States Patent

Roberts

Patent Number: 5,811,156
Date of Patent: Sep. 22, 1998

[54] METHOD OF MAKING A COLOR FILTER ARRAY BY COLORANT TRANSFER AND ETCH

[75] Inventor: Luther C. Roberts, Rochester, N.Y.

[73] Assignee: Eastman Kodak Company, Rochester, N.Y.

[21] Appl. No.: 788,532

[22] Filed: Jan. 24, 1997

[51] Int. Cl.[6] .................................................. C23C 16/04
[52] U.S. Cl. .................... 427/162; 427/165; 427/248.1; 427/255.6; 427/255.7; 427/270; 427/271; 427/282; 430/7; 430/34; 216/23; 216/41
[58] Field of Search ................................... 427/162, 165, 427/248.1, 255.6, 255.7, 270, 271, 282; 430/7, 34; 216/23, 41

[56] References Cited

U.S. PATENT DOCUMENTS

| | | | |
|---|---|---|---|
| 4,007,372 | 2/1977 | Lenhard et al. | 250/317 |
| 4,147,572 | 4/1979 | Vodakov et al. | 148/175 |
| 4,207,119 | 6/1980 | Tyan | 136/89 |
| 4,315,096 | 2/1982 | Tyan et al. | 136/244 |
| 4,543,275 | 9/1985 | Akashi et al. | 427/250 |
| 4,743,463 | 5/1988 | Ronn et al. | 427/53.1 |
| 4,764,670 | 8/1988 | Pace et al. | 250/226 |
| 4,804,977 | 2/1989 | Long | 346/76 L |
| 4,876,167 | 10/1989 | Snow et al. | 430/7 |
| 4,877,697 | 10/1989 | Vollmann et al. | 430/20 |
| 4,911,733 | 3/1990 | Matsumoto | 8/471 |
| 4,923,860 | 5/1990 | Simons | 503/227 |
| 4,965,242 | 10/1990 | DeBoer et al. | 503/227 |
| 4,978,652 | 12/1990 | Simons | 503/227 |
| 5,073,534 | 12/1991 | Harrison et al. | 503/227 |
| 5,079,214 | 1/1992 | Long et al. | 503/227 |
| 5,166,126 | 11/1992 | Harrison et al. | 503/227 |
| 5,168,406 | 12/1992 | Nelson | 359/855 |
| 5,235,198 | 8/1993 | Stevens et al. | 257/232 |
| 5,252,425 | 10/1993 | Bagchi | 430/201 |
| 5,304,499 | 4/1994 | Bonnet et al. | 437/5 |
| 5,312,779 | 5/1994 | Nelson | 437/225 |
| 5,340,619 | 8/1994 | Chen et al. | 424/498 |
| 5,358,923 | 10/1994 | Mitsuhata et al. | 503/227 |
| 5,366,764 | 11/1994 | Sunthankar | 427/248.1 |
| 5,463,484 | 10/1995 | Brody | 359/68 |
| 5,521,035 | 5/1996 | Wolk et al. | 430/20 |
| 5,529,884 | 6/1996 | Tutt et al. | 430/269 |
| 5,536,333 | 7/1996 | Foote et al. | 136/260 |
| 5,538,831 | 7/1996 | Oshima et al. | 430/201 |

FOREIGN PATENT DOCUMENTS

| | | |
|---|---|---|
| 58-034961 | 3/1983 | Japan . |
| 59-078312 | 5/1984 | Japan . |
| 59-126506 | 7/1984 | Japan . |
| 59-177365 | 10/1984 | Japan . |

*Primary Examiner*—Shrive Beck
*Assistant Examiner*—Timothy Meeks
*Attorney, Agent, or Firm*—James D. Leimbach

[57] ABSTRACT

A method of making a color filter array on a first substrate having an array of pixels, comprising the steps of: providing a transferable colorant on a second substrate and positioning such transferable layer in transferable relationship with the first substrate; transferring the colorant layer to the first substrate layer; applying a photoresist layer onto the colorant layer; and patterning the photoresist to form selected pads over pixels in the array; and etching the colorant layer through the openings in the patterned photoresist, leaving a portion of the colorant layer over the selected pixels.

14 Claims, 4 Drawing Sheets

METHOD OF MAKING A COLOR FILTER ARRAY BY COLORANT TRANSFER AND ETCH

CROSS REFERENCE TO RELATED APPLICATIONS

The present invention is related to U.S. patent application Ser. No. 08/648,772 filed May 16, 1996 and entitled "Method of Forming an Organic Electroluminescent Display Panel," by Littman, et al., U.S. patent application Ser. No. 08/788,537 (Kodak Docket No. 75118) filed concurrently herewith, and entitled "Method for Depositing Organic Layers in Organic Light Emitting Devices," by Tang, et al., U.S. patent application Ser. No. 08/789,590 (Kodak Docket No. 75119) filed concurrently herewith, and entitled "Making Color Filter Arrays By Transferring Colorant Material," by Roberts, et al., U.S. patent application Ser. No. 08/788,108 (Kodak Docket No. 75121) filed concurrently herewith, and entitled "Method of Making Color Filter Arrays By Transferring Two Or More Colorants Simultaneously," by Roberts, et al., and U.S. patent application Ser. No. 08/787,732 (Kodak Docket No. 75123) filed concurrently herewith, and entitled "Method of Making Color Filter Arrays By Colorant Transfer Using Chemical Mechanical Polishing," by Roberts, et al. The disclosures of these related applications are incorporated herein by reference.

FIELD OF THE INVENTION

The present invention relates to methods of making color filter arrays which are particularly suitable for use on image sensors.

BACKGROUND OF THE INVENTION

In making color filter arrays, separate layers of different colors must be formed. Frequently these layers are formed using dye as the colorant material which is imbibed into dye receiving layers which must be of a controlled thickness, and a precise amount of dye must be used to achieve the appropriate color. See, for example, commonly assigned U.S. Pat. No. 4,764,670 to Pace et al. and U.S. Pat. No. 4,876,167 to Snow et al. which describe such a process. An additional problem associated with this process is that the dye receiving layers swell upon the introduction of dyes, limiting the smallest dimension which can be attainable for use over very small pixels. Another problem with this process is that dyes are susceptible to fading on exposure to light.

Color filter arrays may also be fabricated using evaporated colorants which do not involve any receiving polymer. In order to fabricate such color filter arrays over image sensors, a typical process is as follows: A colorant, generally a pigment, is deposited on a semiconductor substrate such as silicon which already has an array of light receiving sites referred to in the art as pixels or photo-sites formed in the substrate. Thereafter, a photoresist layer is coated on the colorant layer and then patterned to leave photoresist over the pixels or photo-sites. An etch process is now performed and the patterned photoresist layer acts as a mask for the colorant layer, such that the colorant is removed except over the selected pixels.

Turning to FIG. 1, which shows a method for making coatings from evaporated organic colorants: A substrate 102 is positioned adjacent to an aperture mask 104. The aperture mask provides an aperture over a portion of the substrate. An organic colorant which is to provide the coating is placed into a source boat 100, which is heated by passing an electric current through it. Alternatively, the boat may be heated by the application of radiant heating from a suitably placed heat source. Upon being heated under reduced pressure, the colorant vaporizes and travels from the source, impinging on mask 105. The portion of colorant vapor which passes through the opening in mask 105 travels along the lines 103, and between those lines, depositing on the substrate 102 and mask 104.

There are a number of problems associated with this technique which involves depositing layers in a partial vacuum and is frequently referred to in the art as physical vapor deposition (PVD). In certain cases, it is difficult to control the thickness and uniformity of the colorant disposed over the pixels. The process of vacuum deposition of the colorant typically requires the use of an appropriate placement of sources or masks or moving substrate fixtures to produce a coating which is uniform. However, the colorant material may deposit on the mask and vacuum fixtures to such a degree that it flakes off, creating undesirable contamination and waste of the colorant, and requiring frequent clean-up. In addition, the moving fixtures may generate undesirable particulate materials which may cause contamination of the substrate.

Some other problems in making color filter arrays by the PVD process are the need to use a large source-to-substrate spacing which requires large chambers and large pumps to reach a sufficient vacuum, and the need for masks which cause low-material utilization and build-up on the mask with the concomitant contamination problems. Very specific off-axis source location relative to the substrate, which is sometimes needed for uniform coating, causes very poor material utilization. Still further, source replenishment problems exist for coating multiple substrates in one pump-down. In addition, when multiple layers are deposited, the process needs to be carefully monitored for the thickness of layers in the multiple colorant coatings in multiple cycles.

SUMMARY OF THE INVENTION

It is an object of the present invention to provide an improved method for making color filter arrays which obviates the above difficulties, provides uniform colorant over the pixels, and provides low cost and high quality image sensors.

This object is achieved by a method of making a color filter array on a first substrate having an array of pixels, comprising the steps of:

a) providing a transferable colorant layer on a second substrate and positioning such transferable layer in transferable relationship with the patterned photoresist layer;

b) transferring the colorant material to the first substrate;

c) applying a photoresist layer onto the colorant layer, d) patterning the photoresist layer to form selected pads over pixels in the array, and e) etching the colorant layer through the openings in the photoresist layer, leaving behind a portion of the colorant layer over the selected pixels.

Advantages

Advantages of this technique include the ability to pattern the colorant without the need for a mechanical method to remove colorant from areas where it is not desired. In addition, it provides for an evaporative purification of the colorant during the preparation of the transferable colorant coating and the effective utilization of evaporant materials with high quality uniformity over a large areas. Other advantages include precise control of layer thickness, lower maintenance of deposition vacuum chambers, and minimal monitoring for the deposition process. Still further, It offers the ability to coat at higher pressures and in smaller vacuum chambers which permit faster cycle time and the use of lower-cost vacuum equipment than for standard PVD techniques.

It will be understood that the drawings are not to scale and have been shown for clarity of illustration.

DETAILED DESCRIPTION OF THE INVENTION

Figure 1:
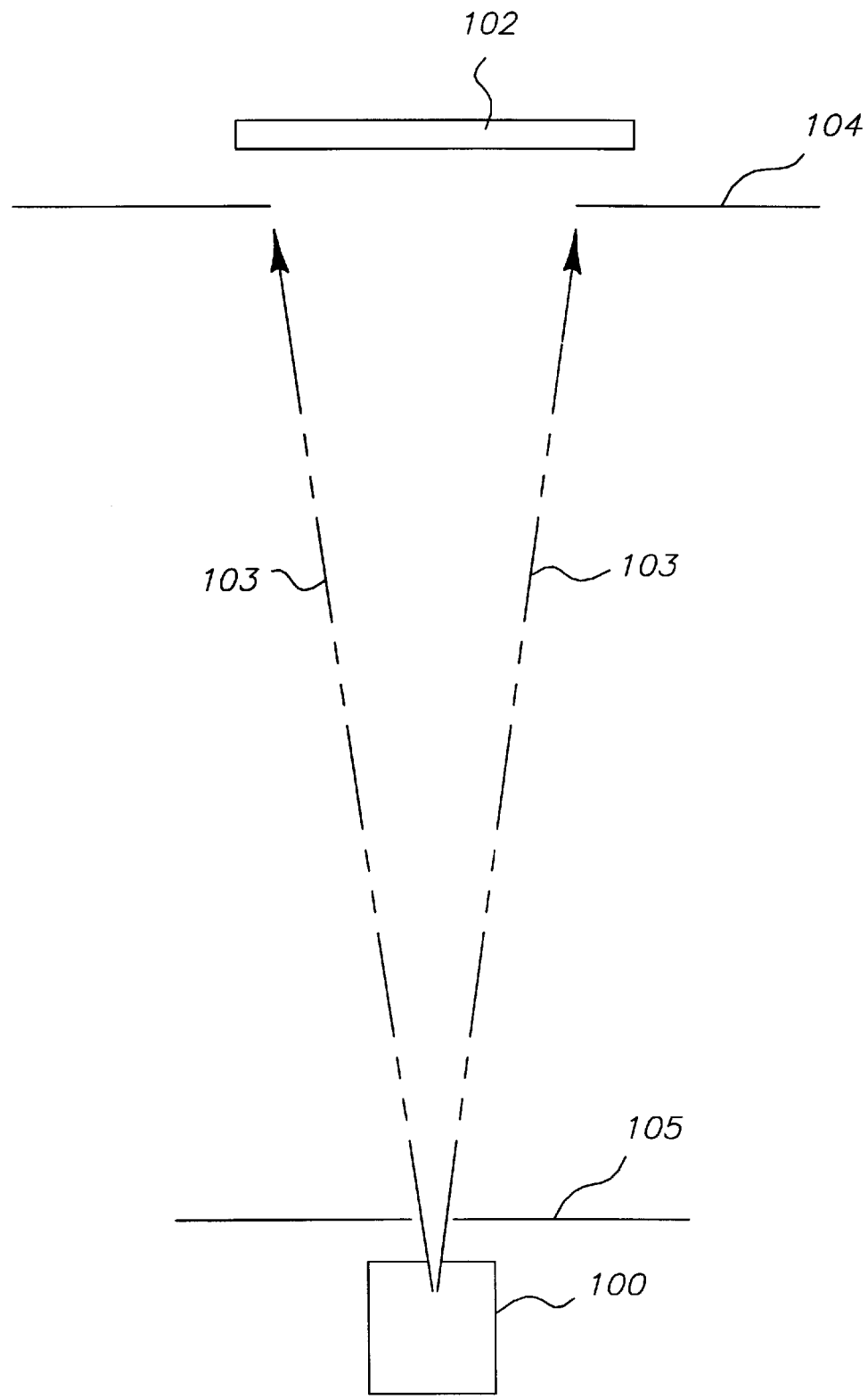
FIG. 1 shows a typical configuration for conventional physical vapor deposition (PVD).

Turning first to FIG. 1, an arrangement for conventional PVD is shown, including a heated source 100, containing the material to be deposited, the substrate 102, and masks 104 and 105 which restrict the material vapor to paths 103 and the region in between.

Figure 2:
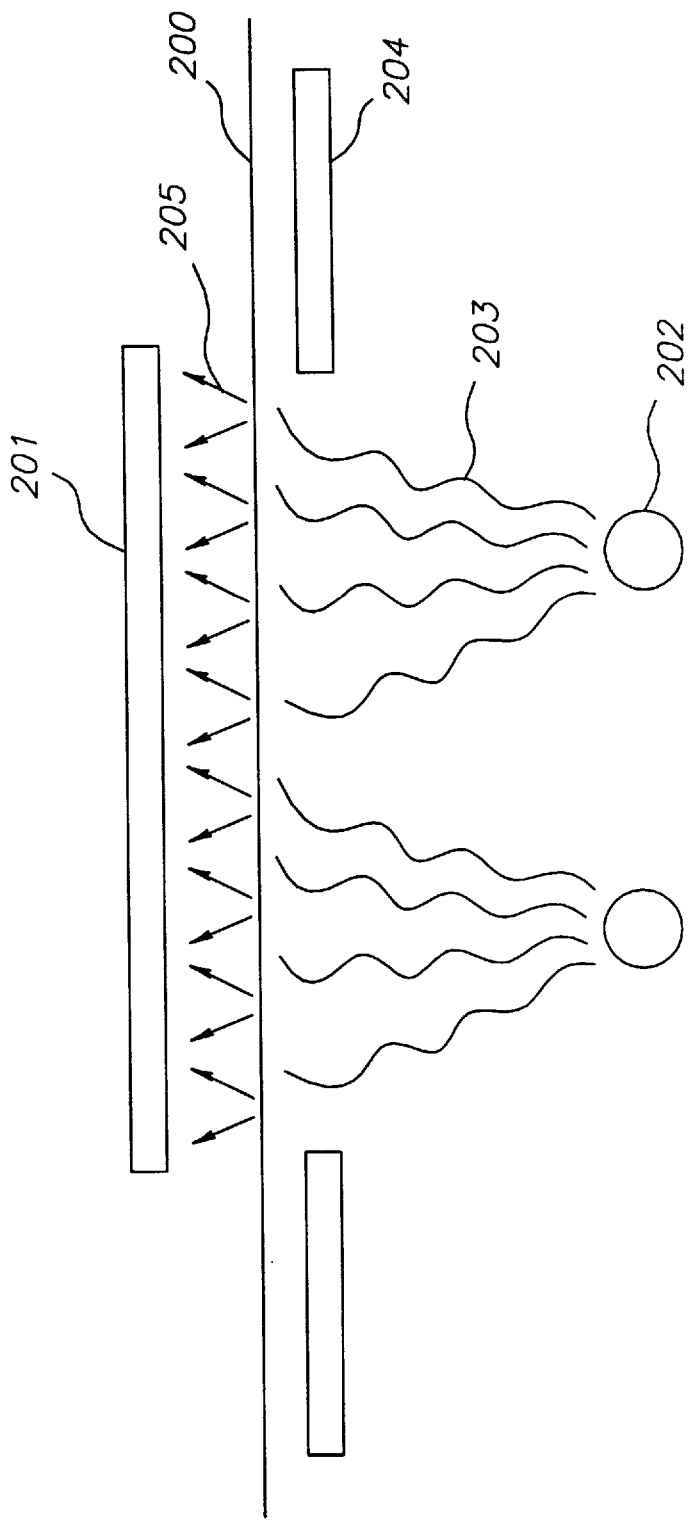
FIG. 2 shows a typical configuration for the thermal transfer of a material from an intermediate substrate to the final substrate, according to the present invention.

In FIG. 2 is shown a configuration for the transfer of a material which has been deposited as a coating on the first substrate 200, onto the second substrate 201 as indicated by the arrows 205 and which is promoted by heating with heat sources 202 as indicated by radiant heat 203 acting through an aperture 204.

Figure 3A:
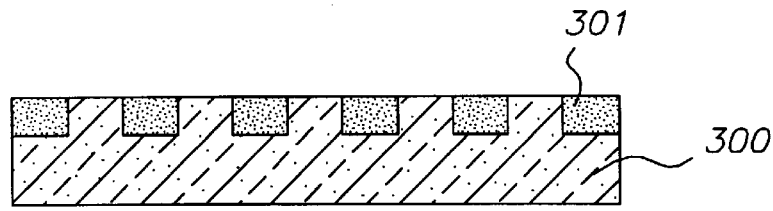
FIGS. 3A–I show various steps in a method according to the present invention for making color filter arrays.

Turning next to FIG. 3A where a silicon substrate 300 is shown, the substrate has already been processed to provide wells for different dopant materials to form pixels 301. As is well understood to those skilled in the art, the substrate may be a composite of different layers. The upper most layer of the substrate may be an adhesion promoting layer. For a more complete description of the construction of image sensors, see commonly assigned U.S. Pat. No. 5,235,198.

Figure 3B:
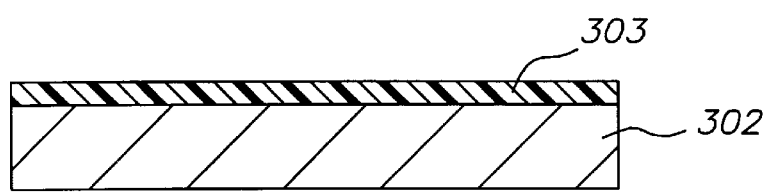

As shown in FIG. 3B, where a second substrate 302 is provided. (This substrate typically is stainless steel, but other substrate materials can be used which are heat resistant and flexible.) A first colorant layer 303 is formed on the substrate 302. Typically, the colorant layer is formed by physical vapor deposition, which provides uniform layers of controlled thickness, containing no materials with higher volatility than the colorant. The layer 303 can be an organic colorant which is transferable upon the application of energy such as heat. In a preferred embodiment of the present invention, the colorant is vaporized by heating under reduced pressure, and condensed on a moving strip of stainless steel foil which is passed over the heated source at a constant rate.

Figure 3C:
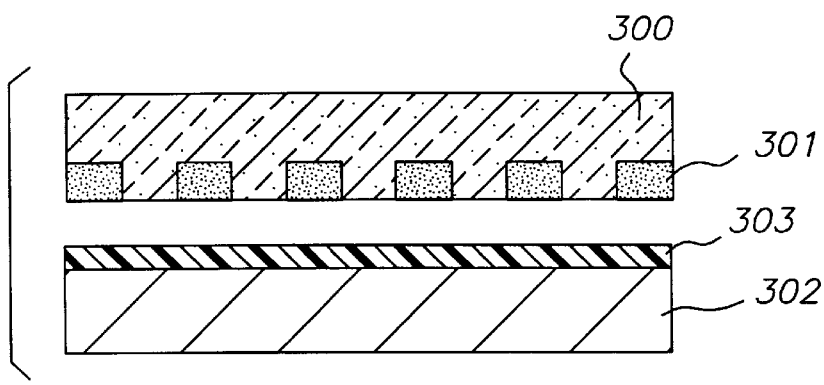

As shown in FIG. 3C, the substrate 302 and first colorant layer 303 is shown positioned relative to the substrate 300 and the pixels 301 in the substrate. In the process it is desired to transfer the colorant layer 303 onto the substrate 300 and the pixels 301.

Figure 3D:
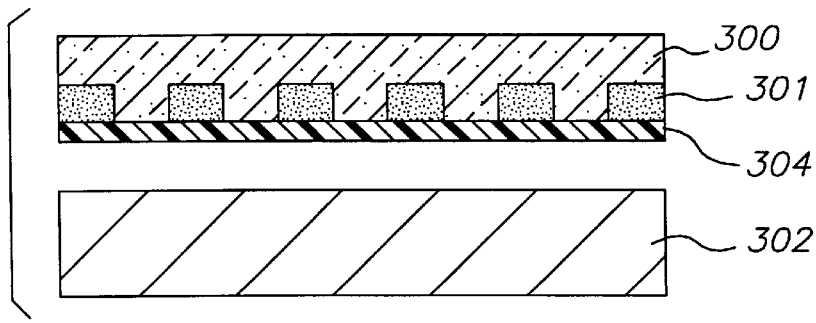

As shown in FIG. 3D, the transferred colorant layer is now labeled number 304. In order to provide this transfer, heat is applied to the substrate 302. Typically, the substrate is composed of metals, such as steel or aluminum or of a temperature-resistant plastic such as a polyimide film. Heating is often done by exposing the non-coated side of the substrate 302 to electromagnetic radiation of wavelengths which are absorbed by the substrate or by the colorant coating and are converted into heat by radiationless decay processes. The electromagnetic radiation may be applied over a large area simultaneously as from an extended lamp source, or it may be applied as a scanned beam as with a modulated laser or a moving lamp source. It is appreciated that imagewise light exposure may be used to heat and transfer only a portion of the colorant coating. Another method used to heat substrate 302 in order to transfer the first colorant 303 is to pass an electric current through the substrate, particularly when the substrate used is composed entirely or partially of metal. In still another method, the substrate may be heated by direct contact with an object such as a metal block, a high temperature roller, or other such devices which can be heated or pre-heated to the required temperature and which can transfer heat to the substrate by direct thermal contact. Typical distances and pressures for the transfer of colorant are from about 0.1 mm to about 3 mm at pressures of less than or equal to about 0.1 Torr, up to a distance of about 50 mm at pressures of less than 0.001 Torr.

Figure 3E:
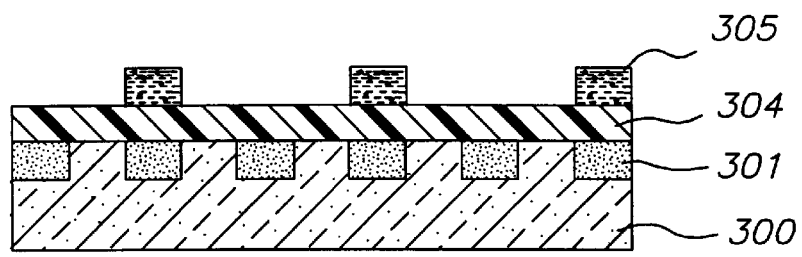

As shown in FIG. 3E, a photoresist layer 305 is formed and patterned on the first colorant layer 304 to provide protection of portions of the colorant layer over first selected pixels 301. Such patterning techniques are well known to those skilled in the art. Typically, the photoresist layer 305 can be imagewise exposed to light, illuminating particular areas of the layer 305. A development step is then used to remove openings in all areas except over the first selected pixels 301 providing the desired pattern.

Figure 3F:
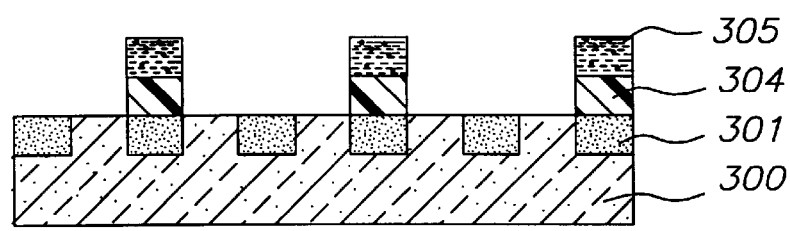

As shown in FIG. 3F, the portions of the first colorant layer 304 not covered by the photoresist 305 are removed by etching, in which the photoresist 305 acts as a mask, such that colorant is left behind only over the first selected pixels 301

Figure 3G:
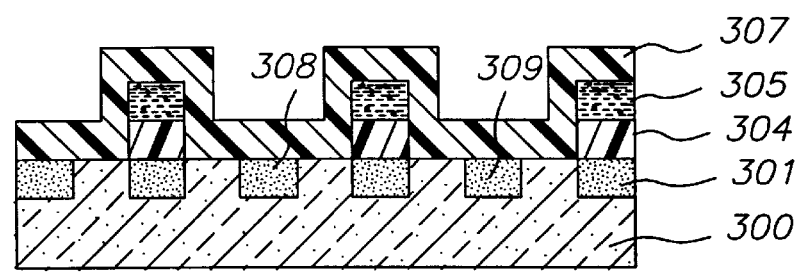

As shown in FIG. 3G, a second colorant layer 307 is deposited on the substrate 300, over the first selected pixels 301, and over the remaining pixels 308 and 309. The same process is used to deposit the second colorant layer as was used to deposit the first colorant layer.

Figure 3H:
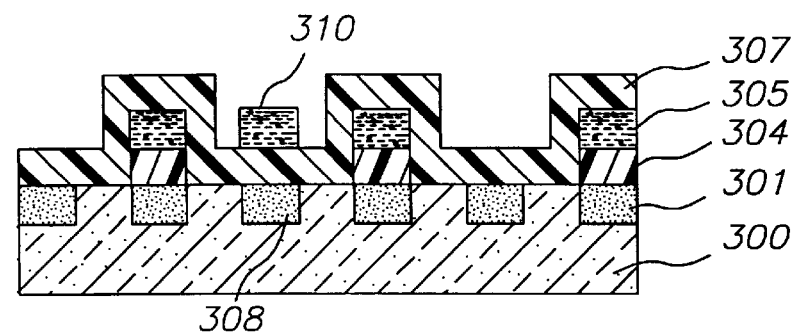

As shown in FIG. 3H, a photoresist layer 310 is formed and patterned over the second colorant layer, above second selected pixels 308.

Figure 3I:
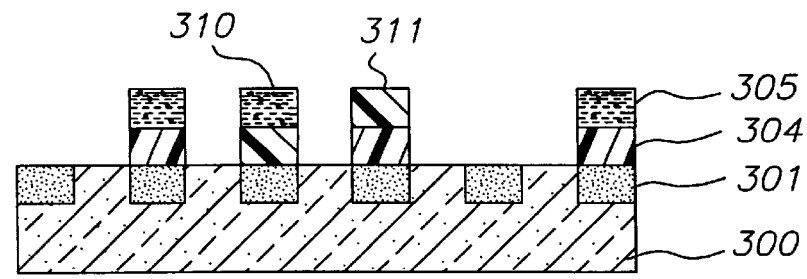

As shown in FIG. 3I, an etch step removes the second colorant layer except above the second selected pixels, where it is protected by photoresist layer 308, leaving a patterned second colorant layer 311.

The steps g)-i) are repeated to form a third patterned colorant layer above third selected pixels 309.

Colorants which are useful in the processes shown in FIGS. 3A–I, include the following: phthalocyanines, such as Pigment Blue 15, nickel phthalocyanine, chloroaluminum phthalocyanine, hydroxy aluminum phthalocyanine, vanadyl phthalocyanine, titanyl phthalocyanine, and titanyl tetrafluorophthalocyanine; isoindolinones, such as Pigment Yellow 110 and Pigment Yellow 173; isoindolines, such as Pigment Yellow 139 and Pigment Yellow 185; benzimidazolones, such as Pigment Yellow 151, Pigment Yellow 154, Pigment Yellow 175, Pigment Yellow 194, Pigment Orange 36, Pigment Orange 62, Pigment Red 175, and Pigment Red 208; quinophthalones, such as Pigment Yellow 138; quinacridones, such as Pigment Red 122, Pigment Red 202, and Pigment Violet 19; perylenes, such as Pigment Red 123, Pigment Red 149, Pigment 179, Pigment Red 224, and Pigment Violet 29; dioxazines, such as Pigment Violet 23; thioindigos, such as Pigment Red 88, and Pigment Violet 38; epindolidiones, such as 2,8-difluoroepindolidione; anthanthrones, such as Pigment Red 168; isoviolanthrones, such as isoviolanthrone; indanthrones, such as Pigment Blue 60; imidazobenzimidazolones, such as Pigment Yellow 192; pyrazoloquinazolones, such as Pigment Orange 67; diketopyrrolopyrroles, such as Pigment Red 254, Irgazin DPP RubinTR, Cromophtal DPP OrangeTR; Chromophtal DPP Flame Red FP (all of Ciba-Geigy); and bisaminoanthrones, such as Pigment Red 177.

EXAMPLES

Example 1.

Commercially obtained copper phthalocyanine was heated by passing electrical current through the tantalum boat which contained it, while maintaining a reduced pressure of approximately 6×10-5 Torr in a vacuum bell jar. About 0.2 microns of phthalocyanine were deposited onto a section of stainless steel foil, having a thickness of about 25 microns. The coated foil was then mounted about 3 mm distant from a silicon wafer which had been spin-coated with about 1 micron of poly(methyl glutarimide), "PMGI" from Microelectronics Chemical Corp., and then coated with about 1.3 microns of photoresist AZ5214IR (Hoechst Celanese Corp.) which was subsequently patterned and developed, and the non-coated side of the foil was positioned about 25 mm from an array of heat lamps (General Electric, Part no. QH500T3/CL) spaced about 30 mm apart. The assembly was subjected to a vacuum of about 6×10E-5 Torr and the heat lamps were powered for 60 seconds to transfer the phthalocyanine to the silicon wafer. The wafer was removed from the vacuum chamber and subjected to ultrasound in a tray of acetone for 90 seconds, using a Branson Model 3200 ultrasonic bath. The photoresist was completely removed by this treatment, leaving intact the copper phthalocyanine features in the desired pattern.

Example 2.

Commercially obtained copper phthalocyanine was heated by passing electrical current through the tantalum boat which contained it, while maintaining a reduced pressure of about 6×10E-5 Torr in a vacuum bell jar.

About 0.2 microns of phthalocyanine were deposited onto a section of stainless steel foil, having a thickness of about 25 microns. The coated foil was then mounted about 3 mm distant from a glass substrate, and the foil was clamped between two electrodes. The assembly was subjected to a vacuum of about 0.1 Torr, and electric current was passed through the foil (at 30 volts) for about 10 sec., causing the ends of the foil to reach a temperature of about 260 degrees C. and the phthalocyanine to transfer to the glass substrate.

The foregoing detailed description recites the most preferred embodiment of practicing the invention. However, it should be understood that variations to the disclosed embodiment will be obvious to those skilled in the relevant arts. Therefore, the invention should be viewed in terms of the appended claims.

| Parts List | |
|---|---|
| 100 | heat source |
| 102 | substrate |
| 103 | paths |
| 104 | mask |
| 105 | mask |

| Parts List | |
|---|---|
| 200 | first substrate |
| 201 | second substrate |
| 202 | heat sources |
| 203 | radiant heat |
| 204 | aperture |
| 205 | arrows |
| 300 | substrate |
| 301 | pixels |
| 302 | substrate layer |
| 303 | first colorant layer |
| 304 | transferred colorant layer |
| 305 | photoresist layer |
| 307 | colorant layers |
| 308 | pixels |
| 309 | pixels |
| 310 | photoresist layer |
| 311 | colorant layer |

I claim:

1. A method of making a color filter array on a first substrate having an array of pixels, comprising the steps of:
    a) providing a transferable colorant layer on a second substrate and positioning the transferable colorant layer in transferable relationship with the first substrate;
    b) transferring the transferable colorant layer to the first substrate wherein the transferring step is performed with a distance of <50 mm between the first substrate and the second substrate;
    c) applying a photoresist layer onto the transferable colorant layer on the first substrate; and
    d) patterning the photoresist layer to form a plurality of photoresist pads over selected pixels in the array and a plurality of openings between the pads; and
    e) etching the transferable colorant layer on the first substrate through the openings in the patterned photoresist, leaving a portion of the transferable colorant layer over the selected pixels.

2. The method of claim 1 wherein the transferring step includes heating the transferable colorant material layer to transfer it to the first substrate.

3. The method of claim 1 further comprising the step of repeating steps a)-e) to form color filters of different colors.

4. The method of claim 1 wherein the transferring step is performed at pressures <0.1 Torr.

5. The method of claim 1 wherein the transferring step is performed at pressures <0.1 Torr and with a distance of <3 mm between the first substrate and the second substrate.

6. The method of claim 1 wherein the transferring step is performed at pressures <0.0001 Torr and with a distance of <30 mm between the first substrate and the second substrate.

7. The method of claim 1 wherein the transferable colorant layer further comprises a compound that is selected from the group consisting of: phthalocyanines; isoindolinones; benzimidazolones; quinophthalones; quinacridones; perylenes; dioxazines; epindolidiones; isoviolanthrones; indanthrones; imidazobenzimidazolones; pyrazoloquinazolones; diketopyrrolopyrroles; and bisaminoanthrones.

8. A method of making a color filter array on a first substrate having an array of pixels, comprising the steps of:
    a) forming an adhesion promoting layer over the pixels of the first substrate;
    b) providing a transferable colorant layer on a second substrate and positioning such transferable layer in transferable relationship with the first substrate;

c) transferring the transferable colorant layer to the first substrate wherein the transferring step is performed with a distance of <50 mm between the first substrate and the second substrate;

d) applying a photoresist layer onto the transferable colorant layer upon the first substrate;

e) patterning the photoresist layer to form a plurality of photoresist pads over selected pixels ion the array and a plurality of openings between the pads; and f) etching the transferable colorant layer on the first substrate through the plurality of openings in the patterned photoresist, leaving a portion of the transferable colorant layer over the selected pixels.

9. The method of claim 8 wherein the transferring step includes heating the colorant material layer to transfer it to the first substrate.

10. The method of claim 8 further comprising the step of repeating steps b)-f) to form color filters of different colors.

11. The method of claim 8 wherein the transferring step is performed at pressures <0.1 Torr.

12. The method of claim 8 wherein the transferring step is performed at pressures <0.1 Torr and with a distance of <3 mm between the first substrate and the second substrate.

13. The method of claim 8 wherein the transferring step is performed at pressures <0.0001 Torr and with a distance of <30 mm between the first substrate and the second substrate.

14. The method of claim 8 wherein the transferable colorant layer further comprises a compound that is selected from the group consisting of: phthalocyanines; isoindolinones; benzimidazolones; quinophthalones; quinacridones; perylenes; dioxazines; epindolidiones; isoviolanthrones; indanthrones; imidazobenzimidazolones; pyrazoloquinazolones; diketopyrrolopyrroles; and bisaminoanthrones.

* * * * *